(12) United States Patent
Chen et al.

(10) Patent No.: US 10,383,248 B1
(45) Date of Patent: Aug. 13, 2019

(54) LOCKING MECHANISM AND SERVER HAVING THE SAME

(71) Applicant: Super Micro Computer Inc., San Jose, CA (US)

(72) Inventors: Richard S. Chen, San Jose, CA (US); Ken-Sheng Lin, San Jose, CA (US); Shih-Hsing Chien, San Jose, CA (US)

(73) Assignee: SUPER MICRO COMPUTER INC., San Jose, CA (US)

( * ) Notice: Subject to any disclaimer, the term of this patent is extended or adjusted under 35 U.S.C. 154(b) by 0 days.

(21) Appl. No.: 15/988,884

(22) Filed: Jun. 15, 2018

(51) Int. Cl.
| | | |
|---|---|---|
| A47B 95/00 | (2006.01) | |
| H05K 7/14 | (2006.01) | |
| H05K 7/18 | (2006.01) | |
| H05K 7/16 | (2006.01) | |

(52) U.S. Cl.
CPC ......... *H05K 7/1489* (2013.01); *H05K 7/1401* (2013.01); *H05K 7/1487* (2013.01); *H05K 7/16* (2013.01); *H05K 7/18* (2013.01)

(58) Field of Classification Search
CPC ..... A47B 88/43; A47B 88/423; A47B 88/427; A47B 88/473; A47B 88/477; A47B 2210/0016; A47B 2210/0018; H05K 7/183; H05K 7/1489
See application file for complete search history.

(56) References Cited

U.S. PATENT DOCUMENTS

| | | | | |
|---|---|---|---|---|
| 7,364,244 B2* | 4/2008 | Sandoval | ............ | H05K 7/1411 312/333 |
| 8,282,176 B1* | 10/2012 | Chen | .................... | A47B 88/493 312/333 |
| 9,894,798 B2* | 2/2018 | Chen | ...................... | H05K 7/183 |
| 9,901,171 B1* | 2/2018 | Dubina | ................. | A47B 88/45 |
| 2004/0056572 A1* | 3/2004 | Chen | ......................... | E05C 3/14 312/333 |
| 2008/0122333 A1* | 5/2008 | Tseng | ................... | A47B 88/473 312/333 |
| 2009/0294393 A1* | 12/2009 | Chen | ................... | H05K 7/1489 211/175 |
| 2012/0076446 A1* | 3/2012 | Chen | ...................... | A47B 88/43 384/21 |
| 2012/0126681 A1* | 5/2012 | Katsuraya | ............... | H01T 13/50 313/135 |
| 2013/0032678 A1* | 2/2013 | Chen | ................... | H05K 7/1421 248/224.8 |

(Continued)

*Primary Examiner* — Matthew W Ing
(74) *Attorney, Agent, or Firm* — Chun-Ming Shih; HDLS IPR Services

(57) ABSTRACT

A locking mechanism and server having the same are provided. The locking structure is assembled to a rack having a positioning hole. The server including a slide rail assembly, a chassis and a locking structure. The slide rail assembly includes an outer slide rail and an inner slide rail. The chassis is fixed to one side of the inner slide rail and movable with the inner slide rail. The locking structure is fastened to the positioning hole and fixed to the inner slide rail. The locking structure includes a housing, a handle, a hook element, and a resilient element. When the handle is rotated to drive the hook element to be detached from the positioning hole, the chassis is released and movable with respect to the rack. The locking structure has a simple structural design, so costs can be reduced.

18 Claims, 14 Drawing Sheets

(56) References Cited

U.S. PATENT DOCUMENTS

| | | | |
|---|---|---|---|
| 2016/0150659 A1* | 5/2016 | Chen | H05K 7/1487 312/223.2 |
| 2016/0157610 A1* | 6/2016 | Chen | H05K 7/1489 248/219.3 |
| 2017/0156498 A1* | 6/2017 | Chen | E05B 65/46 |
| 2017/0196354 A1* | 7/2017 | Chen | H05K 7/1489 |
| 2019/0059585 A1* | 2/2019 | Chen | A47B 57/38 |

* cited by examiner

LOCKING MECHANISM AND SERVER HAVING THE SAME

TECHNICAL FIELD

The present invention relates to a locking mechanism and, in particular, to a locking mechanism and a server having the same.

BACKGROUND

A server typically incorporates a chassis. The chassis is slid into a cabinet by using a slide rail assembly and is fastened to a rack, by using a fastening mechanism, to prevent the chassis from being accidentally detached from the rack.

In conventional servers, the fastening mechanism is directly assembled to the chassis, and then is fastened to the rack. When the fastening mechanism malfunctions or is damaged, it has to be detached, repaired or replaced, resulting in vibrations in the chassis, which may compromise the performance of the server or damage components inside. Furthermore, the conventional fastening mechanism has a complicate structure with more components inside, leading to high costs.

In view of this, the inventor studied various technologies and created an effective solution in the present disclosure.

SUMMARY

It is an objective of the present invention to provide a locking mechanism and a server having the same, lowering costs by its simple structural design.

It is another objective of the present invention to provide a locking mechanism and a server having the same. The locking structure is not directly assembled to the chassis, so assembling and replacement are simple and convenient.

It is still another objective of the present invention to provide a locking mechanism and a server having the same, whereby a chassis is more securely fixed.

Accordingly, the present invention provides a server having a locking mechanism, the server comprising a slide rail assembly, a chassis and a locking structure. The slide rail assembly is assembled to the rack. The slide rail assembly includes an outer slide rail and an inner slide rail slidable with respect to the outer slide rail. The chassis is fixed to one side of the inner slide rail and movable with the inner slide rail. The locking structure is fastened to a positioning hole of a rack and fixed to the inner slide rail. The locking structure includes a housing, a handle pivotally rotatable with respect to the housing, a hook element movable in association with the handle, and a resilient element for restoring the hook element to an initial position. When the handle is rotated to drive the hook element to be detached from the positioning hole, the chassis is released and movable with respect to the rack.

Accordingly, the present invention further provides a locking mechanism which is mounted on an inner slide rail of a slide rail assembly. The locking mechanism includes a housing, a handle pivotally rotatable with respect to the housing, a hook element movable in association with the handle, and a resilient element for restoring the hook element to an initial position, wherein the handle is rotated to drive the hook element to rotate with respect to the inner slide rail, so as to pull the inner slide rail to slide with respect to the slide rail assembly.

In the present embodiment, the handle includes a first pivot portion pivotally connected to the housing and a pivot block protruding from the first pivot portion. The hook element includes a second pivot portion pivotally connected to the housing and includes a hook portion and a push portion connected to the second pivot portion at its two sides. A length from the second pivot portion to the push portion is larger than a length from the first pivot portion to the pivot block, so it is much easier for the push portion to drive rotation of the pivot block, and thereby the hook element can automatically return to the initial position.

The locking structure has a simple structural design and allows convenient operations and easy assembling, and therefore costs are significantly reduced. The locking structure is not directly assembled to the chassis, thus greatly reducing vibration occurrence in the chassis during processes of unlocking the locking structure and withdrawing or pushing back the chassis, thereby protecting components inside the chassis.

Another advantage of the present embodiment is that an elastic hook is utilized to further ensure the securing effect between the slide rail assembly and the rack, so the chassis can be more securely fixed to the slide rail assembly.

BRIEF DESCRIPTION OF THE DRAWINGS

The disclosure will become more fully understood from the detailed description and the drawings given herein below for illustration only, and thus does not limit the disclosure, wherein.

DETAILED DESCRIPTION

Figure 1:
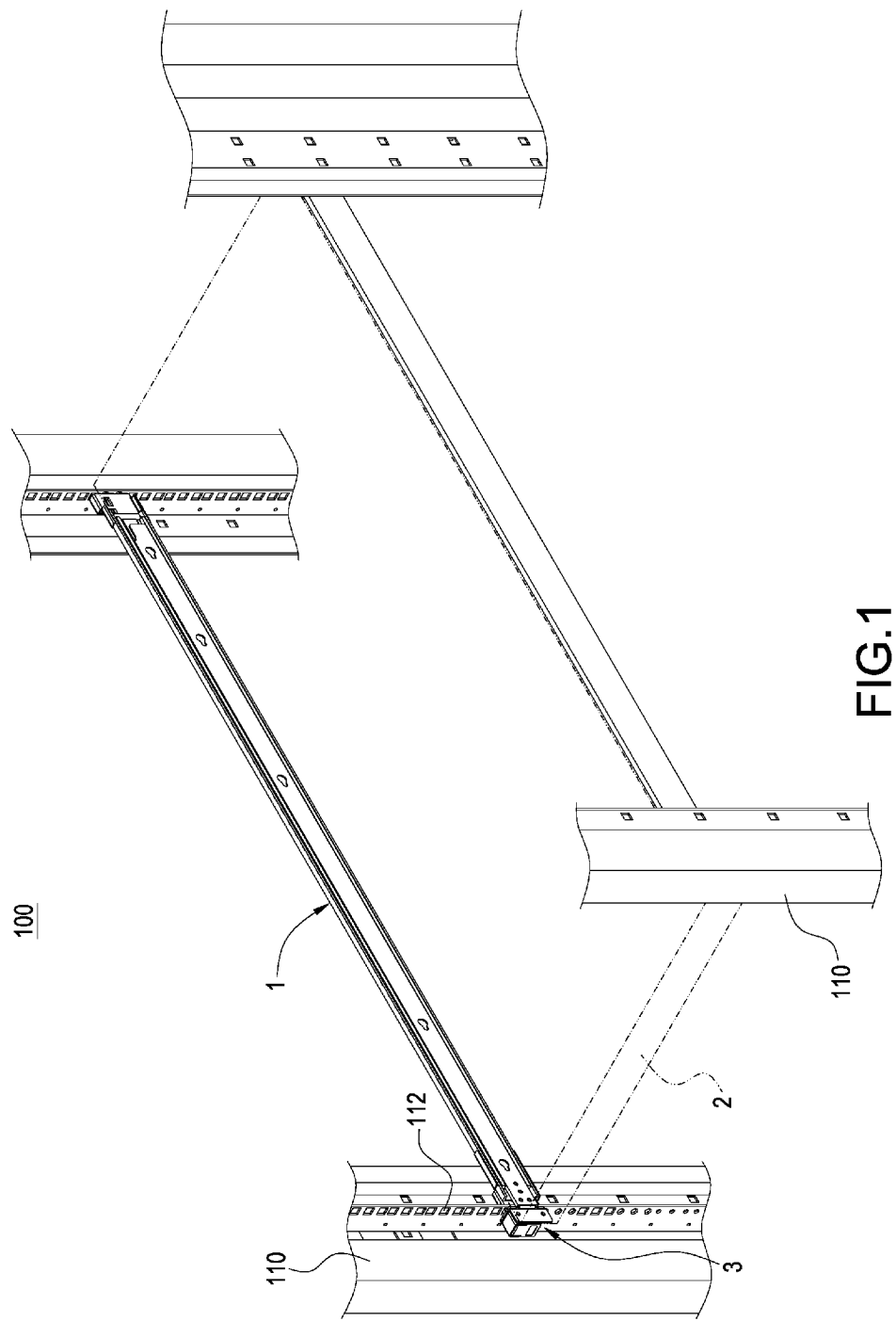
FIG. 1 is a perspective view of a server having a locking mechanism according to the present invention.
Figure 2:
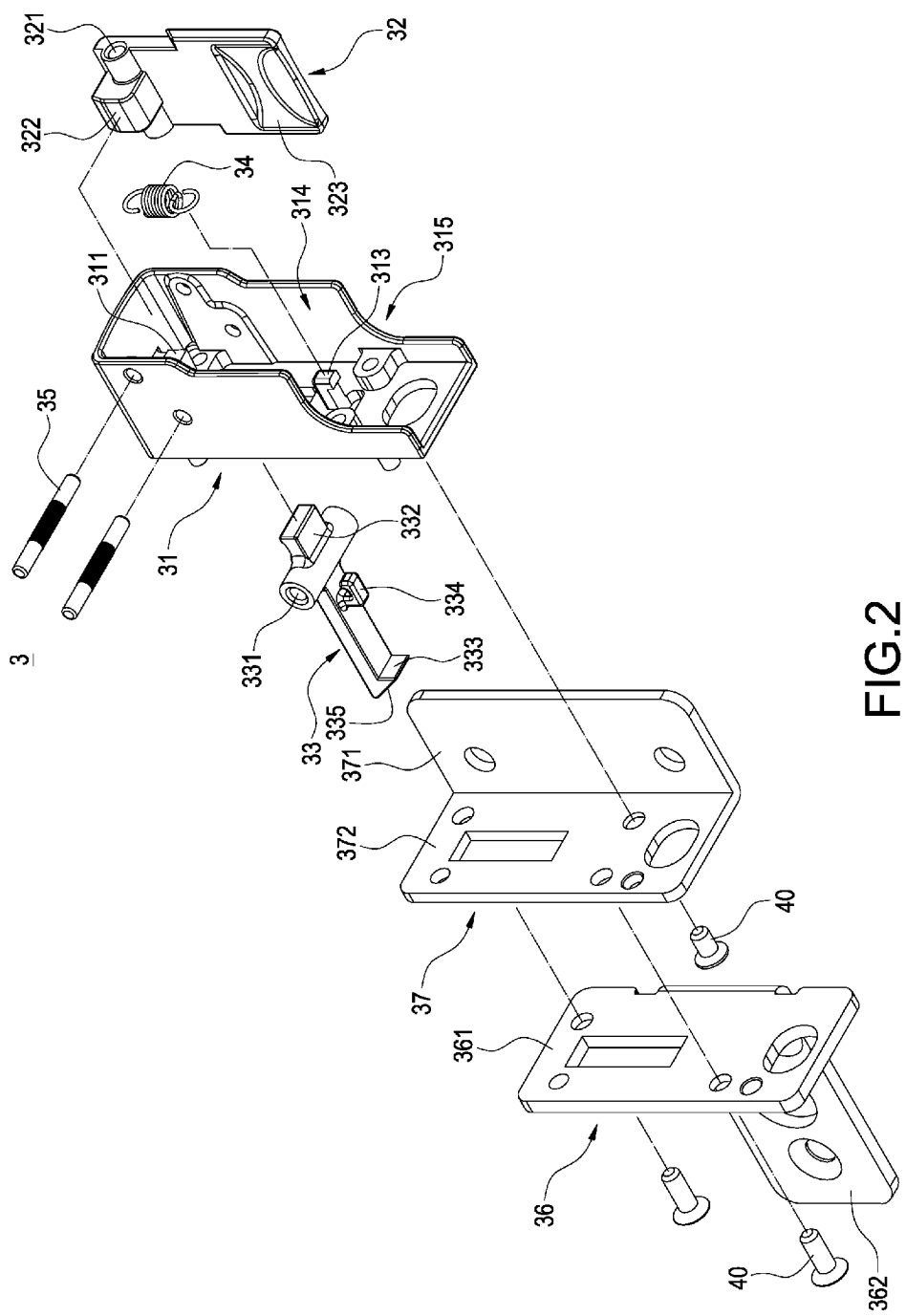
FIG. 2 is an exploded view showing the locking structure.
Figure 3:
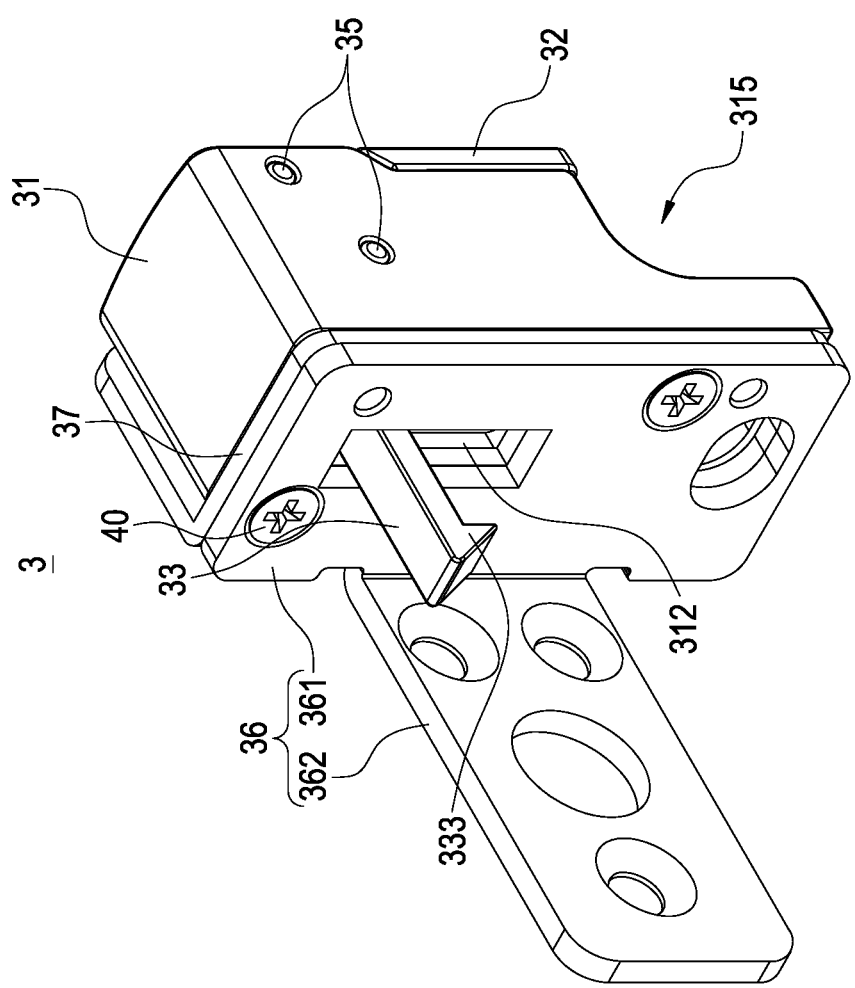
FIG. 3 is a perspective view showing the locking structure.
Figure 4:
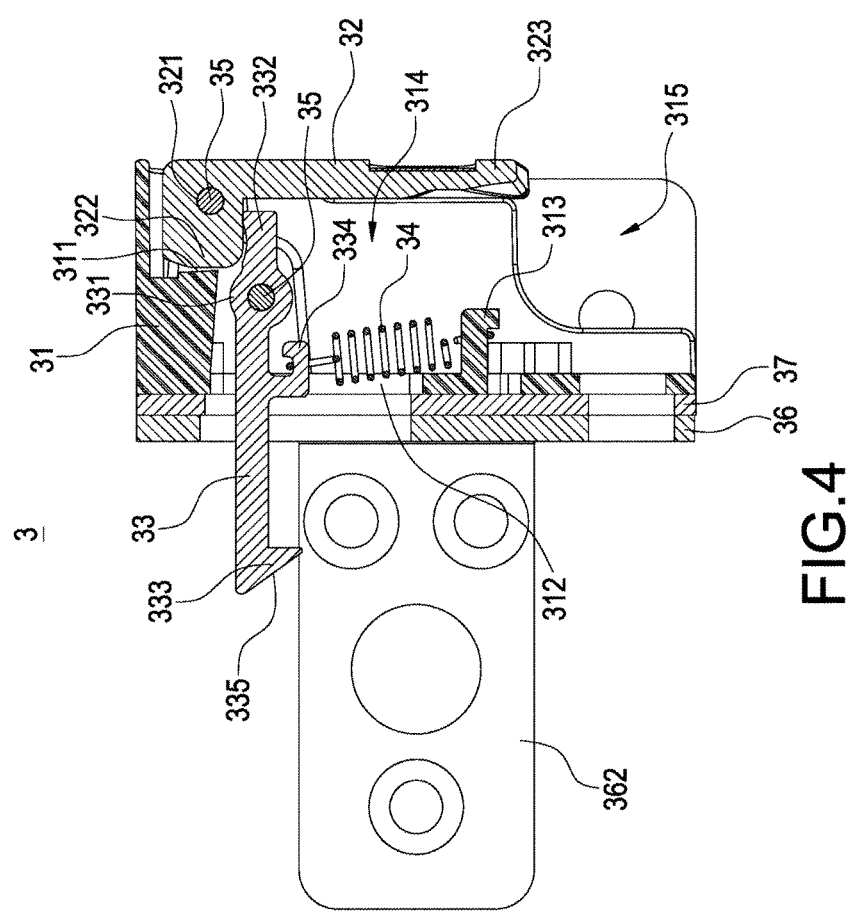
FIG. 4 is a cross-sectional view showing the locking structure.

Detailed descriptions and technical contents of the present disclosure are illustrated below in conjunction with the accompanying drawings. However, it is to be understood that the descriptions and the accompanying drawings disclosed herein are merely illustrative and exemplary and not intended to limit the scope of the present disclosure.

Referring to FIGS. 1 to 7, the present invention provides a server 100 having a locking mechanism. The server 100 comprises a slide rail assembly 1, a chassis 2 and a locking structure 3. The locking structure 3 is fastened to a rack 110 having a positioning hole 112. In the embodiment shown in FIG. 1, it is preferably that there are two slide rail assemblies 1 assembled to the rack 110 to form a cabinet (not labelled), so that the chassis 2 can be withdrawn or pushed into the cabinet. The locking structure 3 is assembled to one single slide rail assembly 1. In other words, each chassis 2 has two locking structures 3 to facilitate a user's withdrawing or pushing back the chassis 2. However, only one slide rail assembly 1 and one locking structure 3 will be described hereinafter for brevity.

The slide rail assembly 1 is assembled to the rack 110, the slide rail assembly 1 includes an outer slide rail 11 and an inner slide rail 12 slidable with respect to the outer slide rail 11. In the embodiment shown in FIG. 5, the slide rail assembly 1 further includes a middle slide rail 13 installed between the outer slide rail 11 and the inner slide rail 12. The middle slide rail 13 can improve the structural strength of the inner slide rail 12 or allow the chassis 2 to be withdrawn a longer distance. The chassis 2 is fixed to one side of the inner slide rail 12 and is moved with the inner slide rail 12.

The locking structure 3 is assembled to the positioning hole 112 of the rack 110 and fixed to the inner slide rail 12 (i.e. fixed to the other side of the inner slide rail 12 opposite to the chassis 2). The locking structure 3 includes a housing 31, a handle 32 pivotally rotatable with respect to the housing 31, a hook element 33 movable in association with the handle 32, and a resilient element 34 for restoring the hook element 33 to an initial position (not labelled). When the handle 32 is rotated to drive the hook element 33 to be detached from the positioning hole 112, the chassis 2 is released and movable with respect to the rack 110.

Referring to FIGS. 2, 3, 4 and 7, the handle 32 includes a first pivot portion 321 pivotally connected to the housing 31 and a pivot block 322 protruding from the first pivot portion 321, and the hook element 33 includes a second pivot portion 331 pivotally connected to the housing 31 and includes a hook portion 333 and a push portion 332 connected to the second pivot portion 331 at its two sides. The push portion 332 is disposed corresponding to the pivot block 322, and the hook portion 333 is detachably fastened to the positioning hole 112.

Figure 8:
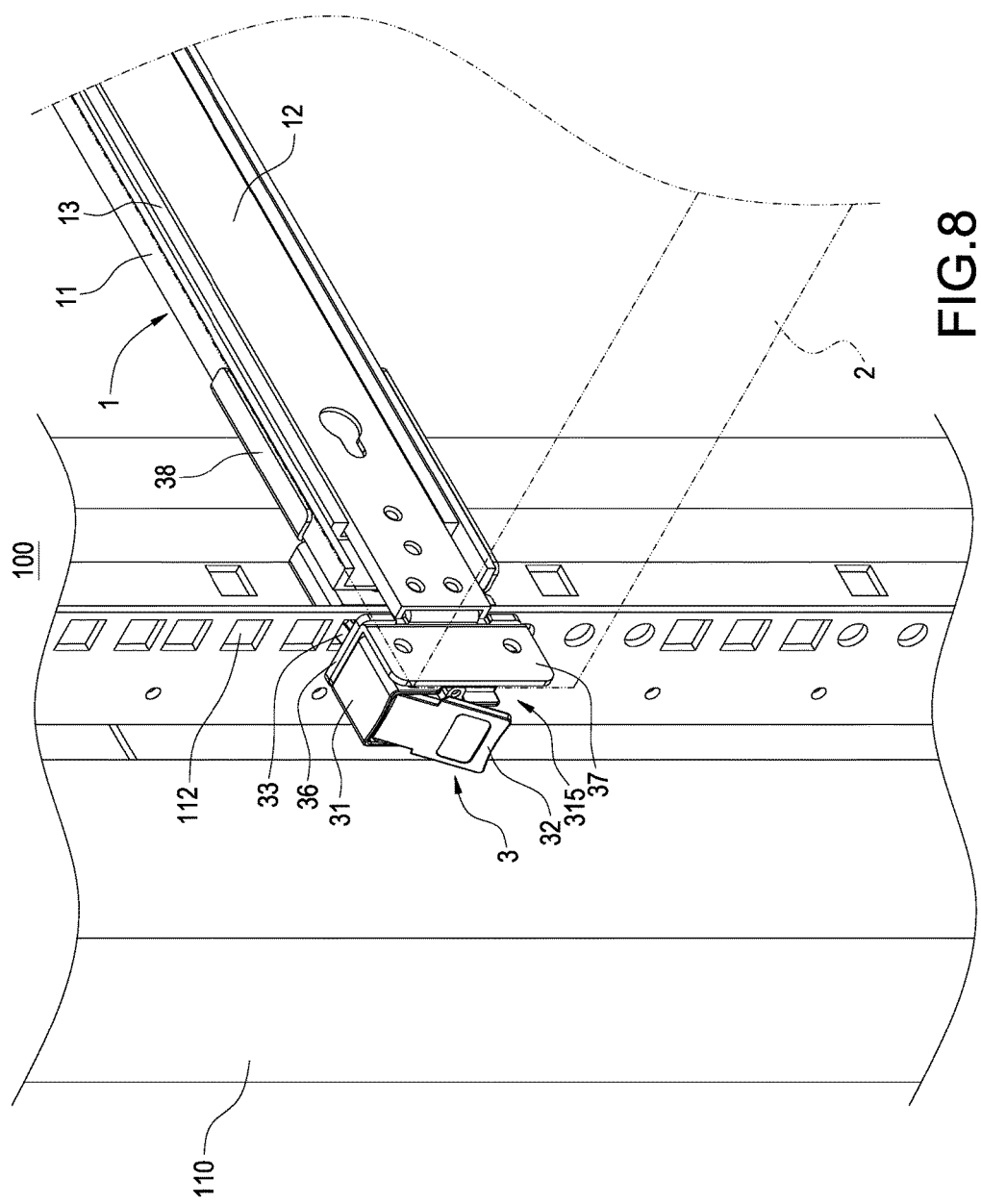
FIG. 8 is a perspective view showing that the locking structure is unlocked.
Figure 9:
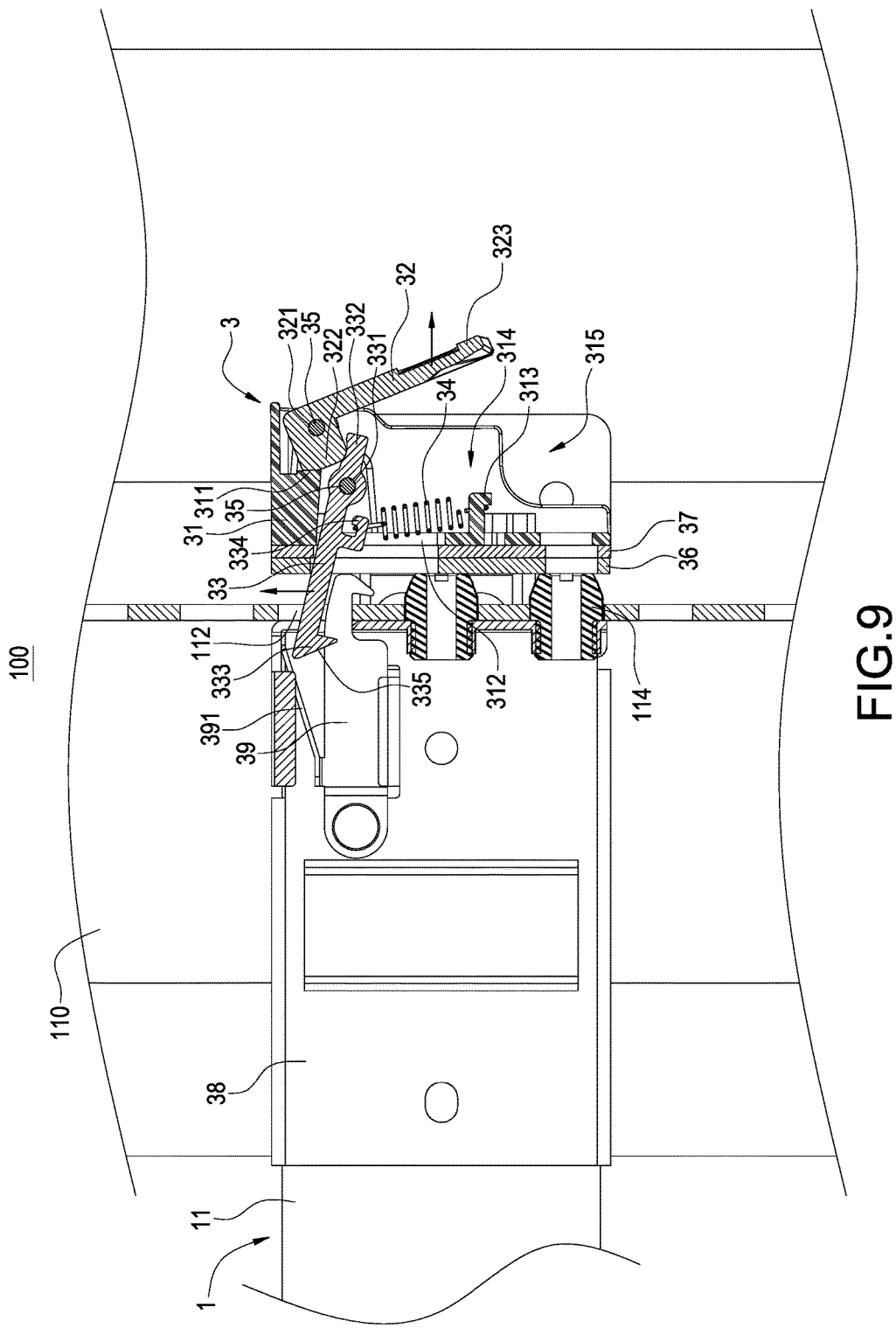
FIG. 9 is a cross-sectional view showing that the locking structure is unlocked.

Referring to FIGS. 8 and 9, the housing 31 further includes a blocker 311 disposed corresponding to the pivot block 322, a hook hole 312 from which the hook element 33 sticks out, and a rod 313 protruding from an inner surface of the housing 31. The blocker 311 prevents over-rotation of the handle 32. The hook element 33 includes a bar 334 disposed between the second pivot portion 331 and the hook portion 333. The rod 313 and the bar 334 are inserted in two ends of the resilient element 34, respectively. The resilient element 34 can store potential energy for restoring the hook element 33 to the initial position (i.e. a locked statement).

The housing 31 further includes an accommodating space 314 receiving the resilient element 34, two shafts 35 inserted through the first pivot portion 321 and the second pivot portion 331 respectively, and an opening 315 communicating with the accommodating space 314. The handle 32 includes a pull part 323 adjacent to the opening 315. Therefore, a user's fingers can pass through the opening 315 to hold the pull part 323 to unlock the locking structure 3.

Each of the shafts 35 is, for example, a pin. The two shafts 35 are pivotally fixed to the housing 31.

Figure 7:
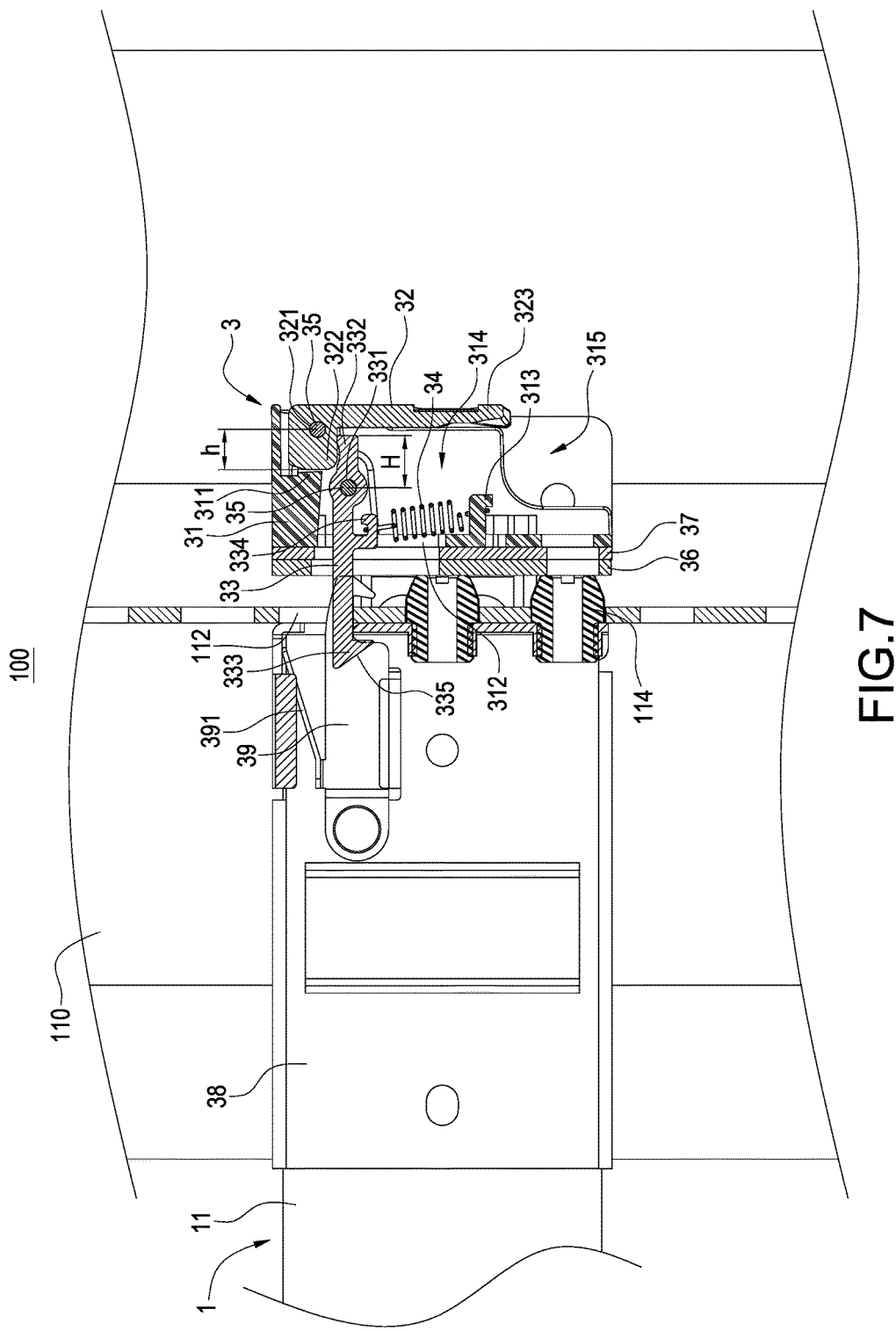
FIG. 7 is a cross-sectional view showing the locking structure assembled to the slide rail assembly.

As shown in FIGS. 7 to 9, a length H from the second pivot portion 331 to the push portion 332 is larger than a length h from the first pivot portion 321 to the pivot block 322. That is to say, a lever arm from the second pivot portion 331 to the push portion 332 is larger than a lever arm from the first pivot portion 321 to the pivot block 322, so it is much easier for the push portion 332 to drive rotation of the drive block 322. In addition, an axis of the first pivot portion 321 and an axis of the second pivot portion 331 are not on the same horizontal plane. As a result, the push portion 332 and the pivot block 322 are movable in association with each other in an abutting manner.

Figure 10:
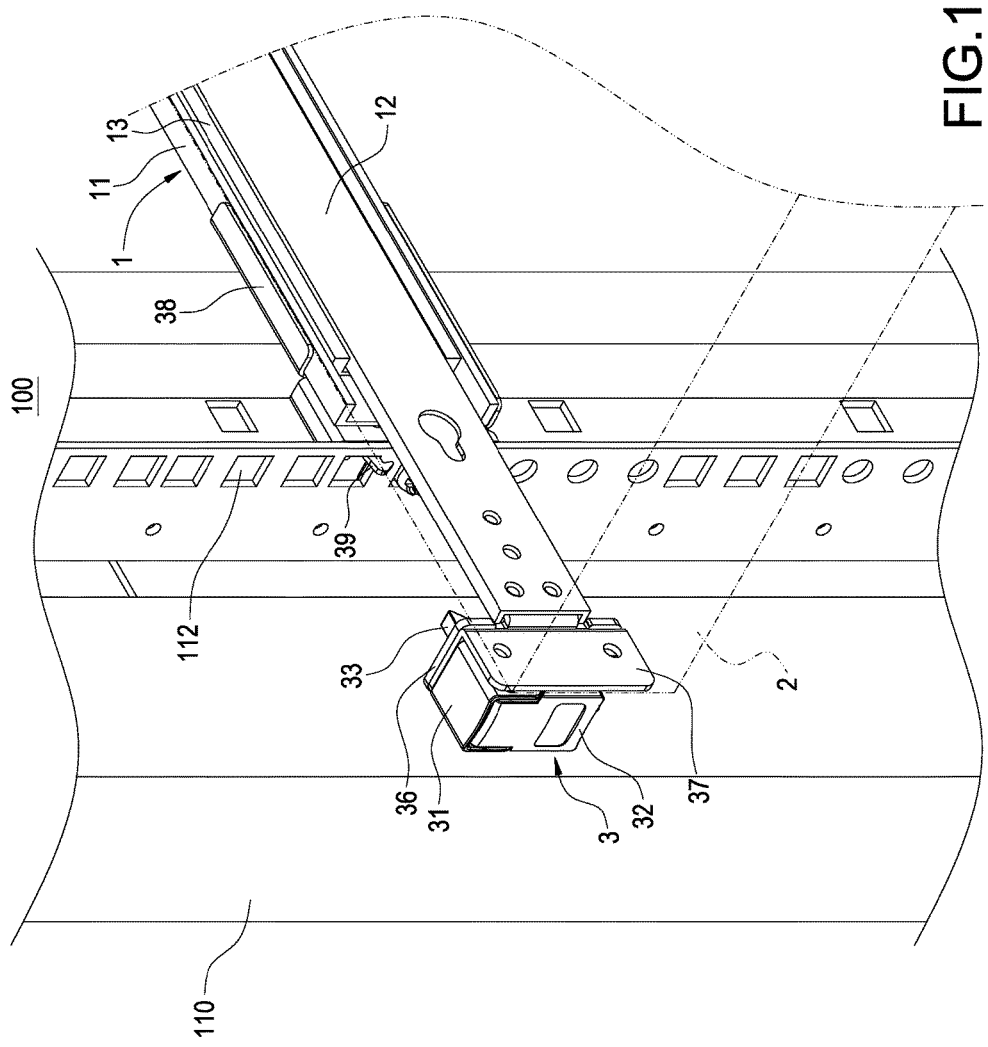
FIG. 10 is a perspective view showing that a chassis is pulled out when the locking structure is detached from a rack.
Figure 12:
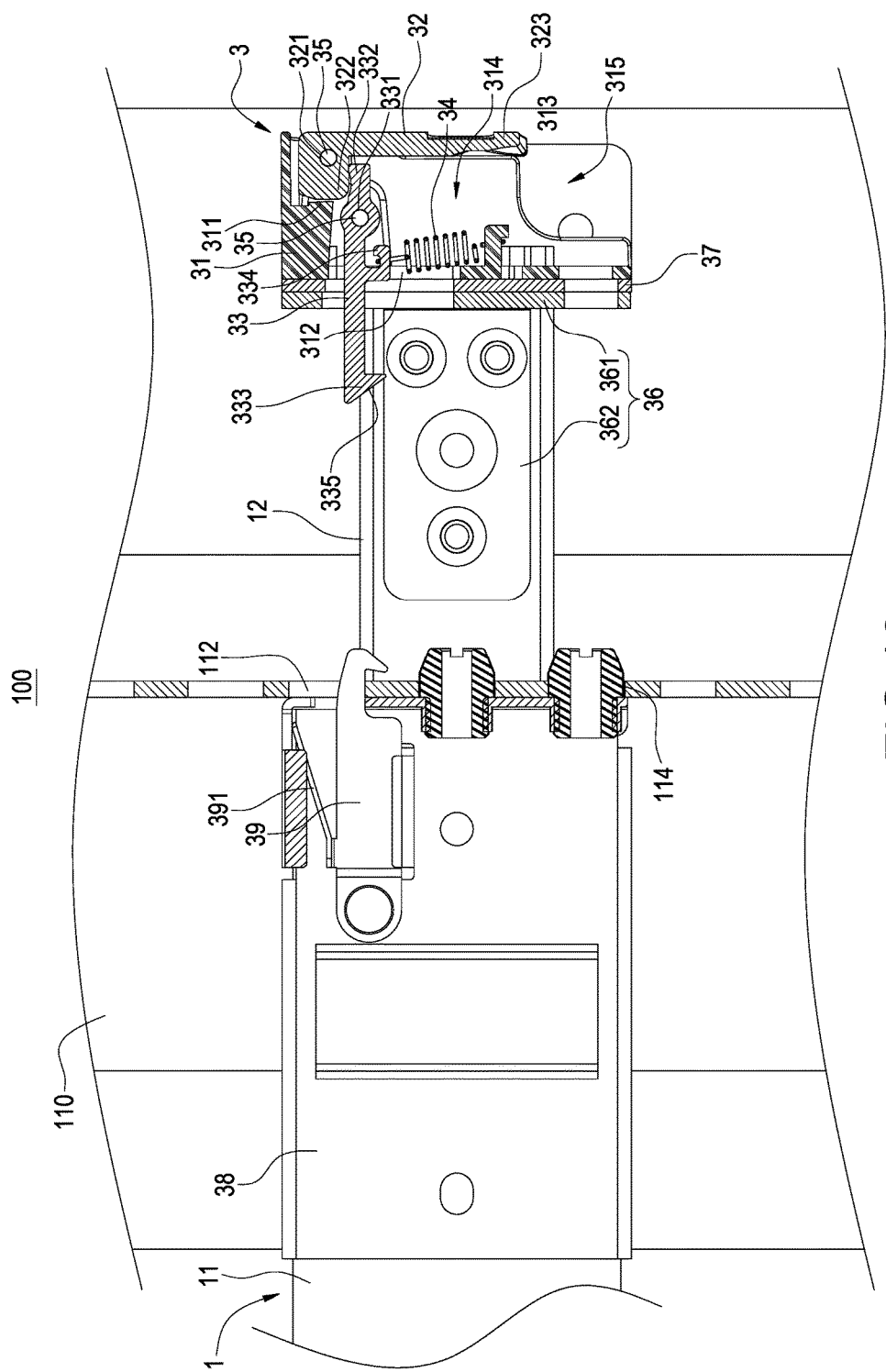
FIG. 12 is a cross-sectional view of FIG. 10.

When the handle 32 is rotated to drive rotation of the hook element 33, the pivot block 322 pushes the push portion 332 to cause the hook portion 333 to rotate about the second pivot portion 331, so the hook portion 333 is tilted to be detached from the positioning hole 112 of the rack 110, and at the same time the resilient element 34 stretches out to store potential energy for automatically restoring the hook element 33 to the original position. As shown in FIG. 10, the user keeps holding the handle 32 and exerts an outward force, then the chassis 2 can be pulled out (i.e. a released state). Referring to FIG. 12, when the user releases the handle 32, the hook portion 333 is pulled back by the resilient element 34, so that the hook element 33 is restored to the original position. It should be noted that, when the resilient element 34 is pulling back the hook portion 333, the push portion 332 easily pushes back the pivot block 322 and restores the handle 32 to the original position due to the lever principle.

Figure 5:
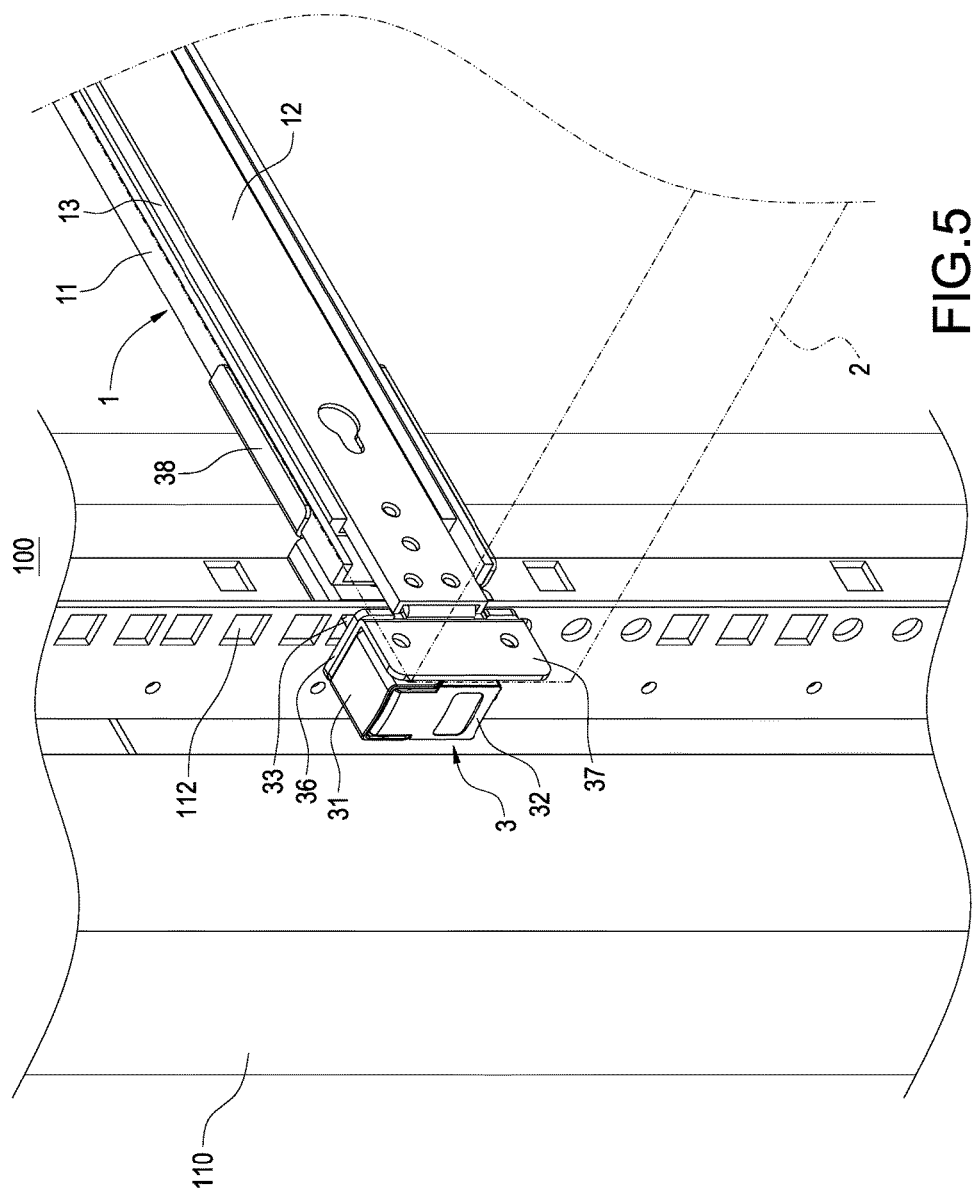
FIG. 5 is a partial perspective view showing the server having the locking mechanism.
Figure 6:
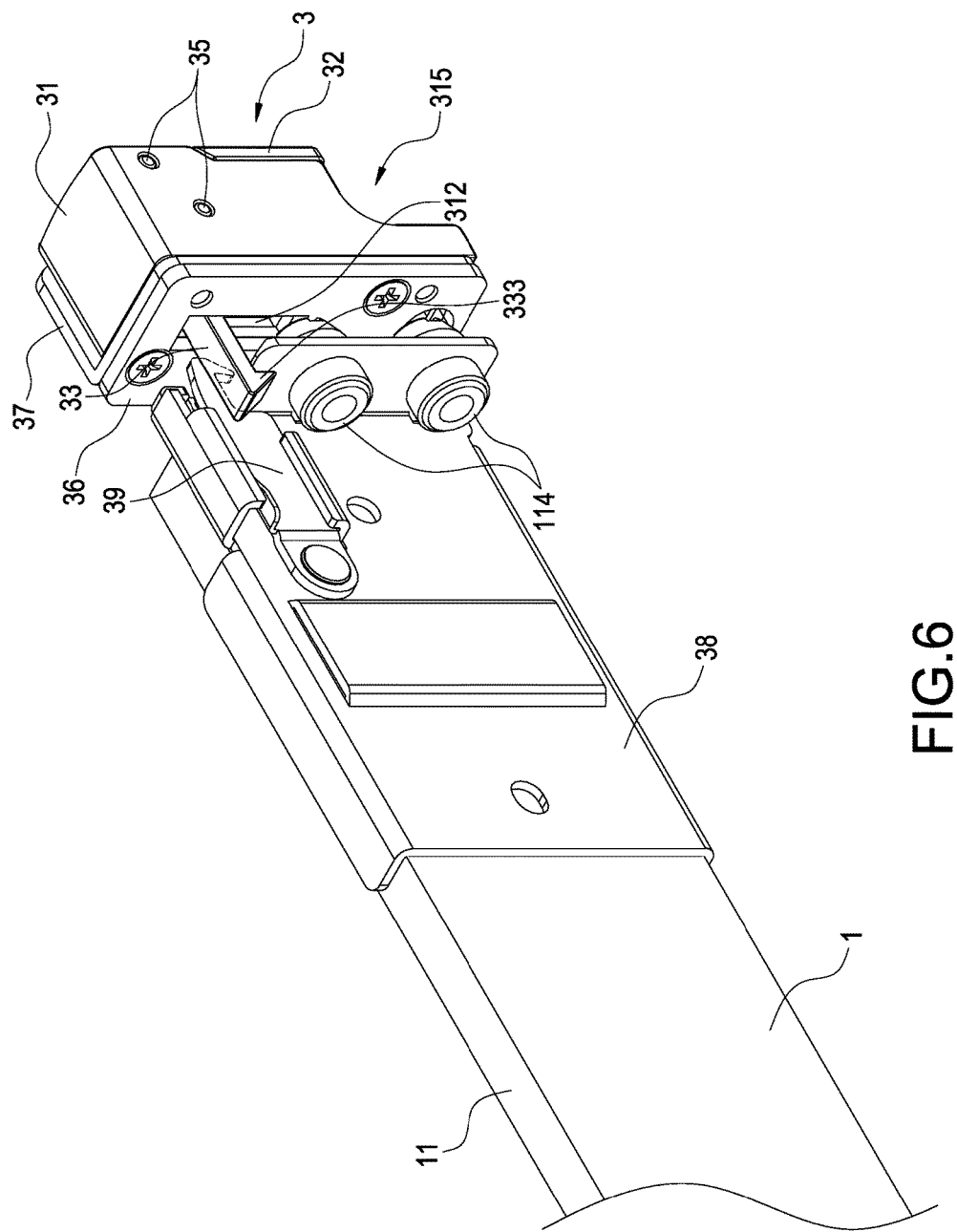
FIG. 6 is a perspective view, taken from a different angle, showing the locking structure assembled to a slide rail assembly.

The hook portion 333 has an inclined surface 335 at its one end corresponding to the positioning hole 112. Therefore, when the user is pushing back the chassis 2, the inclined surface 335 of the hook element 33 can easily pass through the positioning hole 112 to get the hook element 33 fastened to the positioning hole 112. By this way, the locking structure 3 is again in the locked state, i.e. the locking structure 3 is fastened to the rack 110 and the chassis 2 is also secured to the rack 110, as shown in FIGS. 5 and 7.

Referring to FIGS. 1 to 7, the locking structure 3 further includes a fixing element 36. The fixing element 36 includes a first fixing plate 361 fixed to the housing 31 and a second fixing plate 362 perpendicularly connected to the first fixing plate 361. The second fixing plate 362 is fixed to the inner slide rail 12. The locking structure 3 also includes a reinforcing element 37 fixed between the housing 31 and the fixing element 36, the reinforcing element 37 includes a first board 371 fixed to the housing 31 and a second board 372 perpendicularly connected to the first board 371, and the second board 372 is fixed to the first fixing plate 361.

In the present embodiment, the fixing element 36 and the reinforcing element 37 are separately assembled to the housing 31 to improve the structural strength of the housing 31 or enhance the connection rigidity between the housing 31 and the inner slide rail 12. However, in alternative embodiments, one or both of the fixing element 36 and the reinforcing element 37 can be integrally formed with the housing 31, and this may vary as required. In the present embodiment, a plurality of fastening elements 40, such as screws or bolts, are used for fastening between the fixing element 36, the reinforcing element 37, the housing 31, and the inner slide rail 12. The fixing element 36 and the reinforcing element 37 are sized to match the dimensions of the housing 31, and it is preferable that the fixing element 36, the reinforcing element 37 and the housing 31 are all made of metal.

Figure 11:
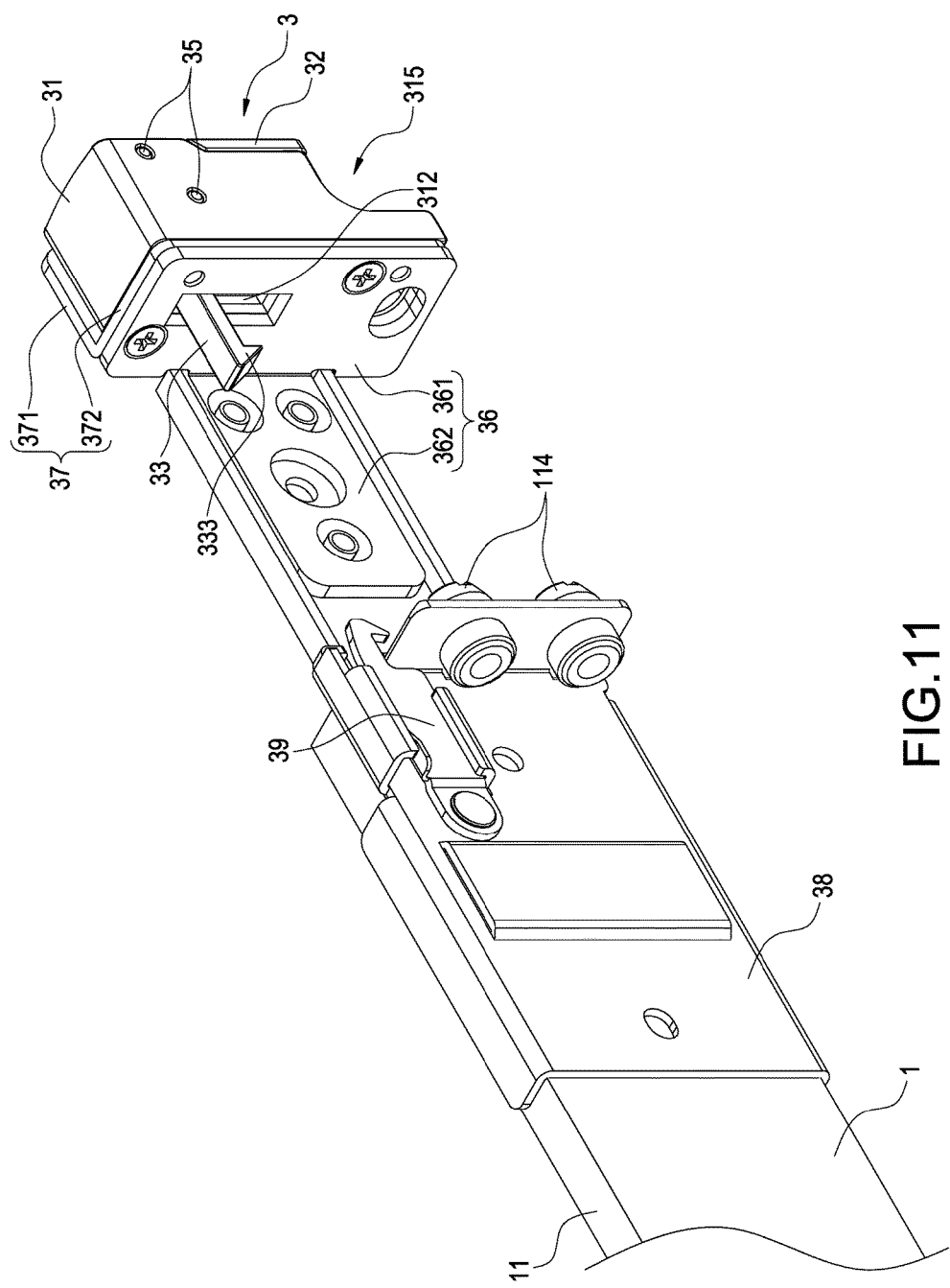
FIG. 11 is a perspective view showing the locking structure viewed from another angle after it is pulled out of the chassis.

In the embodiment shown in FIGS. 11 and 12, the server 100 further includes a coupling element 38 fixed to an outer surface of the outer slide rail 11, an elastic hook 39 disposed on the coupling element 38, and two buffering elements 114 disposed corresponding to the locking structure 3. The elastic hook 39 is used to improve the fastening effect of the slide rail assembly 2 and/or the chassis 2 fixed to the rack 110. One end of the elastic hook 39 is fixed to the coupling element 38, and the other end of the elastic hook 39 is fastened to the positioning hole 112. The elastic hook 39 includes an elastic arm 391, and the elastic arm 391 is in contact with an end edge of the coupling element 38 to keep the elastic hook 39 fastened to the positioning hole 112. The elastic hook 39 and the hook element 33 are arranged side by side and fastened to the same positioning hole 112. Each buffering element 114 is inserted in each positioning hole 112. The buffering element 114 consists of, but is not limited to, rubber or silicone, used to absorb the force for pushing the locking structure 3/chassis 2 back to the cabinet (not labelled), thereby protecting the chassis 2.

Figure 13:
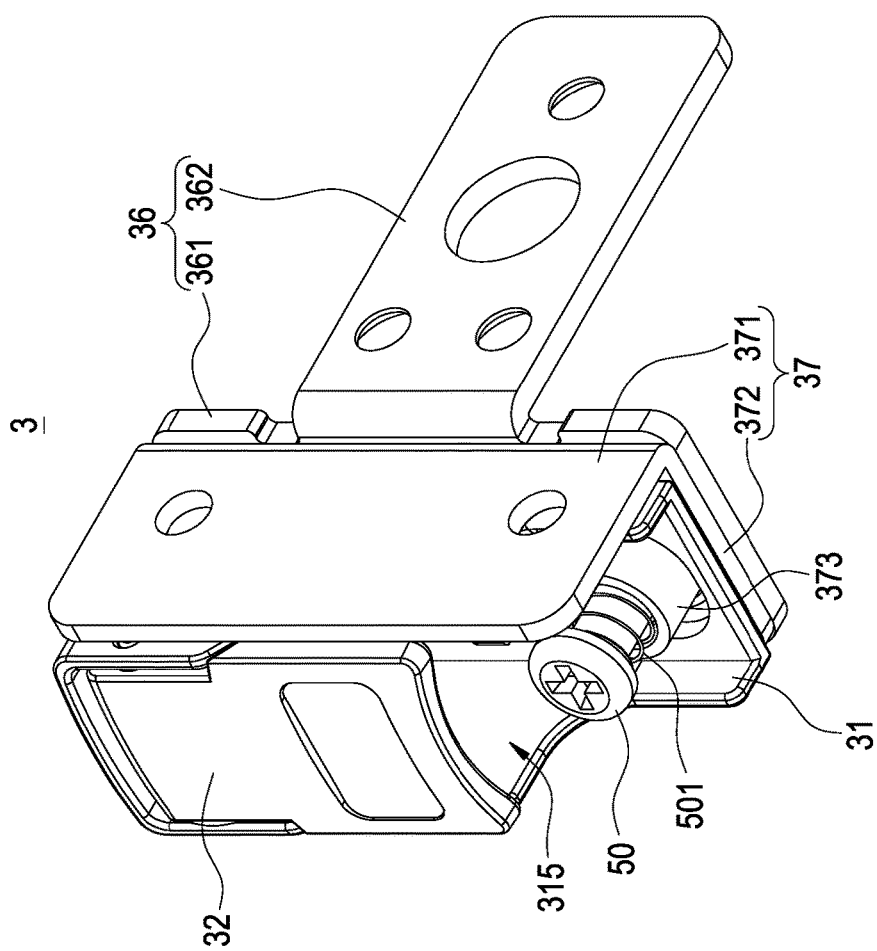
FIG. 13 is a perspective view showing the locking structure according to another embodiment of the present invention.
Figure 14:
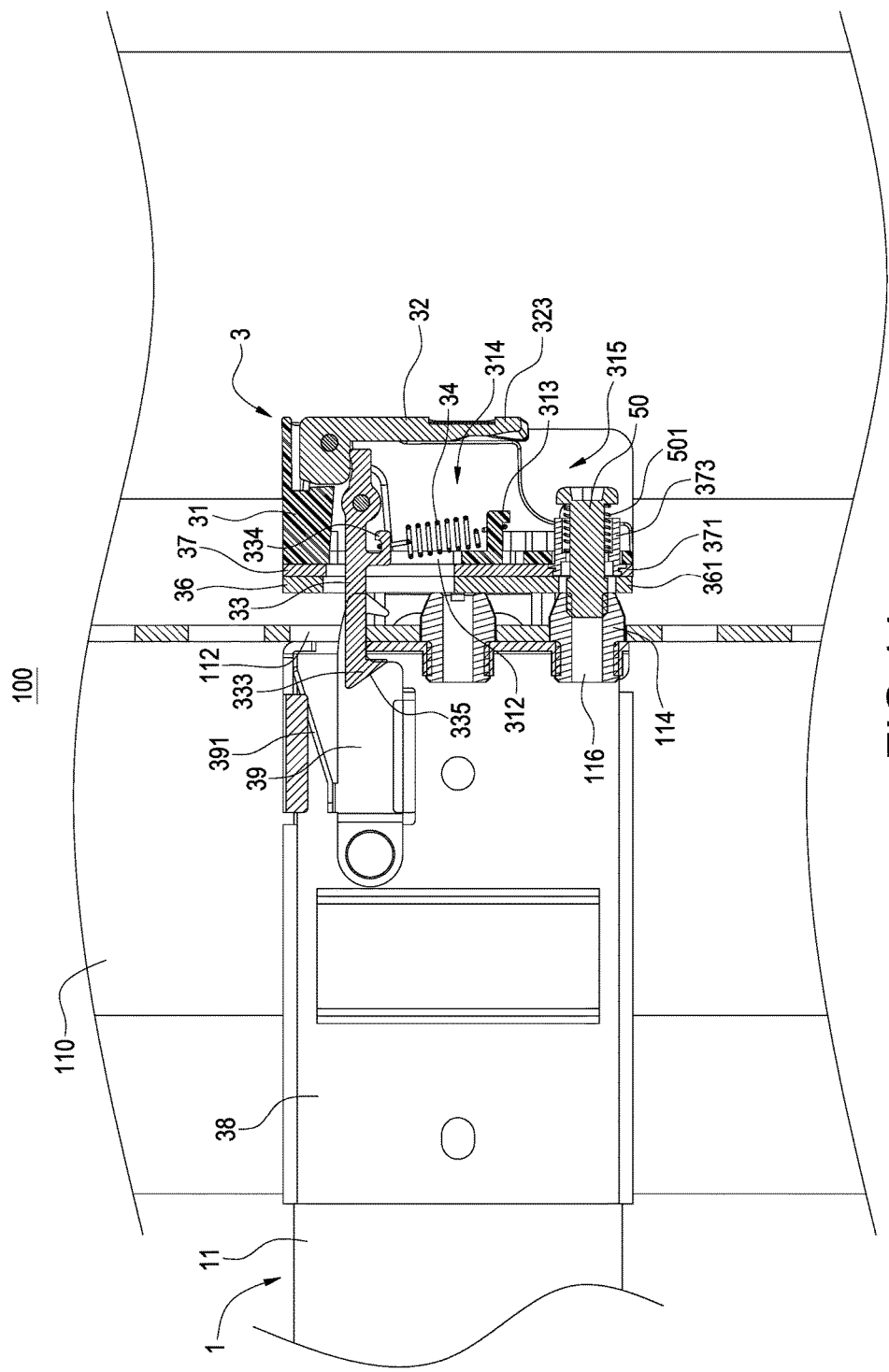
FIG. 14 is a cross-sectional view showing the locking structure assembled to a rack.

Referring to FIGS. 13 and 14, the present embodiment further includes at least one securing element 50 and a spiral spring 501 receiving the securing element 50. The securing element 50 is inserted through the housing 31 of the locking structure 3 and secured to the positioning hole 113. The spiral spring 501 enhances the securing effect. As shown in FIG. 14, the buffering element 114 includes a through hole 116, a sleeve element 373 such as a sleeve is rivet-connected to the second board 372 of the reinforcing element 37, thereby allowing the spiral spring 501 to move stably in the sleeve element 373. The securing element 50 such as a bolt or a screw is inserted through the sleeve element 373, the housing 31, and the through hole 116 of the buffering element 114 to be secured to the positioning hole 112. This makes the chassis 2 more securely fixed to the rack 110.

The present invention further provides a locking mechanism 3 which is mounted on an inner slide rail 12 of a slide rail assembly 1. The locking mechanism 3 includes a housing 31, a handle 32 pivotally rotatable with respect to the housing 31, a hook element 33 movable in association with the handle 32, and a resilient element 34 for restoring the hook element 33 to an initial position, wherein when the handle 32 is rotated to drive the hook element 33 to be rotated and detached from the positioning hole 112 of the chassis 110, the inner slide rail 12 is slidable with respect to the slide rail assembly 1. Other details regarding the rest structure of the locking mechanism 3, a linked relationship of the components thereof, and operations of the slide rail assembly 1 are already described in the foregoing embodiment, so a description thereof is omitted herein for brevity.

The locking structure 3 of this embodiment has a simple structural design and allows convenient operations and easy assembling of all components, and therefore costs are significantly reduced. In addition to that, the locking structure 3 is not directly assembled to the chassis 2, thus greatly reducing vibration occurrence in the chassis 2 during processes of unlocking the locking structure 3 and withdrawing or pushing back the chassis 2, and thereby protecting components inside the chassis 2.

Besides, the elastic hook 39 is utilized to further ensure the securing effect between the slide rail assembly 1 and the rack 110, so the chassis 2 can be more securely fixed to the slide rail assembly 1.

It is to be understood that the above descriptions are merely the preferable embodiment of the present invention and are not intended to limit the scope of the present invention. Equivalent changes and modifications made in the spirit of the present invention are regarded as falling within the scope of the present invention.

What is claimed is:

1. A server having a locking mechanism, comprising:
   a slide rail assembly assembled to a rack, the slide rail assembly including an outer slide rail and an inner slide rail slidable with respect to the outer slide rail;
   a chassis, the chassis being fixed to one side of the inner slide rail and movable with the inner slide rail; and
   a locking structure, the locking structure being fastened to a positioning hole of a rack and fixed to the inner slide rail, the locking structure including a housing, a handle pivotally rotatable with respect to the housing, a hook element movable in association with the handle, and a resilient element for restoring the hook element to an initial position, wherein when the handle is rotated to drive the hook element to be detached from the positioning hole, the chassis is released and movable with respect to the rack,
   wherein the handle includes a first pivot portion pivotally connected to the housing and a pivot block protruding from the first pivot portion, and the hook element includes a second pivot portion pivotally connected to the housing and includes a hook portion and a push portion connected to the second pivot portion at its two sides;
   wherein a length from the second pivot portion to the push portion is larger than a length from the first pivot portion to the pivot block, and an axis of the first pivot portion and an axis of the second pivot portion are not on the same horizontal plane.

2. The server having the locking mechanism according to claim 1, wherein the push portion is disposed corresponding to the pivot block, and the hook portion is fastened to the positioning hole.

3. The server having the locking mechanism according to claim 1, wherein the housing further includes a blocker disposed corresponding to the pivot block, a hook hole from which the hook element sticks out, and a rod protruding from an inner surface of the housing, the hook element includes a bar disposed between the second pivot portion and the hook portion, and the rod and the bar are inserted in two ends of the resilient element respectively.

4. The server having the locking mechanism according to claim 1, wherein the housing includes an accommodating space receiving the resilient element, two shafts inserted through the first pivot portion and the second pivot portion respectively, and an opening communicating with the accommodating space, the handle includes a pull part adjacent to the opening, and the two shafts are pivotally connected to the housing.

5. The server having the locking mechanism according to claim 4, wherein when the handle is rotated to drive rotation of the hook element, the pivot block pushes the push portion to cause the hook portion to rotate about the second pivot portion, so that the hook portion is tilted upwards and detached from the positioning hole, and the resilient element stretches out to store potential energy for restoring the hook element to the initial position.

6. The server having the locking mechanism according to claim 1, wherein the locking structure further includes a fixing element, the fixing element includes a first fixing plate fixed to the housing and a second fixing plate perpendicularly connected to the first fixing plate, and the second fixing plate is fixed to the inner slide rail.

7. The server having the locking mechanism according to claim 6, wherein the locking structure further includes a reinforcing element fixed between the housing and the fixing element, the reinforcing element includes a first board fixed to the housing and a second board perpendicularly connected to the first board, and the second board is fixed to the first fixing plate.

8. The server having the locking mechanism according to claim 1, further comprising a coupling element fixed to an outer surface of the outer slide rail and an elastic hook disposed on the coupling element, wherein one end of the elastic hook is fixed to the coupling element and the other end of the elastic hook is fastened to the positioning hole.

9. The server having the locking mechanism according to claim 8, wherein the elastic hook includes an elastic arm, the elastic arm is in contact with an end edge of the coupling element to keep the elastic hook fastened to the positioning hole.

10. The server having the locking mechanism according to claim 8, wherein the elastic hook and the hook element are arranged side by side and fastened to the same positioning hole.

11. The server having the locking mechanism according to claim 1, further comprising a buffering element disposed corresponding to the locking structure, and the buffering element is inserted in the positioning hole.

12. The server having the locking mechanism according to claim 11, wherein the buffering element includes a through hole and consists of rubber or silicone.

13. The server having the locking mechanism according to claim 1, further comprising at least one securing element, the securing element being inserted through the housing of the locking structure and secured to the positioning hole.

14. The server having the locking mechanism according to claim 13, wherein the securing element is received in a spring to increase a securing effect.

15. A locking mechanism, mounted on an inner slide rail of a slide rail assembly, the locking mechanism comprising a housing, a handle pivotally rotatable with respect to the housing, a hook element movable in association with the handle, and a resilient element for restoring the hook element to an initial position, wherein when the handle is rotated to drive the hook element to rotate with respect to the inner slide rail so as to release the inner slide rail to slide with respect to the slide rail assembly,
wherein the housing further includes a blocker disposed corresponding to the pivot block, a hook hole from which the hook element sticks out, and a rod protruding from an inner surface of the housing, the hook element includes a bar disposed between the second pivot portion and the hook portion, and the rod and the bar are inserted in two ends of the resilient element respectively.

16. The locking mechanism according to claim 15, wherein the handle includes a first pivot portion pivotally connected to the housing and a pivot block protruding from the first pivot portion, and the hook element includes a second pivot portion pivotally connected to the housing and includes a hook portion and a push portion connected to the second pivot portion at its two sides.

17. The locking mechanism according to claim 16, wherein the housing includes an accommodating space receiving the resilient element, two shafts inserted through the first pivot portion and the second pivot portion respectively, and an opening communicating with the accommodating space, the handle includes a pull part adjacent to the opening, and the two shafts are pivotally connected to the housing.

18. A server having a locking mechanism, comprising:
a slide rail assembly assembled to a rack, the slide rail assembly including an outer slide rail and an inner slide rail slidable with respect to the outer slide rail;
a chassis, the chassis being fixed to one side of the inner slide rail and movable with the inner slide rail; and
a locking structure, the locking structure being fastened to a positioning hole of a rack and fixed to the inner slide rail, the locking structure including a housing, a handle pivotally rotatable with respect to the housing, a hook element movable in association with the handle, and a resilient element for restoring the hook element to an initial position, wherein when the handle is rotated to drive the hook element to be detached from the positioning hole, the chassis is released and movable with respect to the rack,
wherein the locking structure further includes a fixing element, the fixing element includes a first fixing plate fixed to the housing and a second fixing plate perpendicularly connected to the first fixing plate, and the second fixing plate is fixed to the inner slide rail;
wherein the locking structure further includes a reinforcing element fixed between the housing and the fixing element, the reinforcing element includes a first board fixed to the housing and a second board perpendicularly connected to the first board, and the second board is fixed to the first fixing plate.

\* \* \* \* \*